ANALOG SUMMER/INTEGRATOR MODE CONTROL CIRCUIT
HAVING DIGITAL/ANALOG SWITCHED INPUTS
Filed Sept. 23, 1971

INVENTORS
GORDON E. SICKEL
GEORGE F. TEMPEL
BY
ATTORNEY

United States Patent Office 3,717,776
Patented Feb. 20, 1973

3,717,776
ANALOG SUMMER/INTEGRATOR MODE CONTROL CIRCUIT HAVING DIGITAL/ANALOG SWITCHED INPUTS

Gordon E. Sickel, Eatontown, and George F. Tempel, Neptune, N.J., assignors to Electronic Associates, Inc., Long Branch, N.J.

Filed Sept. 23, 1971, Ser. No. 183,070
Int. Cl. G06g 7/12
U.S. Cl. 307—229 11 Claims

ABSTRACT OF THE DISCLOSURE

An analog integrator is disclosed in which multiple input resistors are provided thereto. The gain from some of the input resistors to the output of the integrator is higher than the gain from the other input resistors. The lower gain producing resistors are connected to the input of the integrator through a single field-effect transistor digital/analog switching device while each of the higher gain providing input resistors have separate field-effect transistor digital/analog switching devices connecting them to the input. Logic circuitry is provided to interconnect the field-effect transistor digital/analog switching devices to operate as a single switch so that the integrator may be switched thereby from an operate mode (resistors connected) to a hold mode (resistors disconnected). Details of the digital/analog switch are also disclosed in which an inverted transistor is employed to connect each resistor to ground when it is not connected to the input of the integrator.

FIELD OF THE INVENTION

This invention relates to a mode controlled electronic analog integrator for use in an analog computer or other analog computation system.

BACKGROUND OF THE INVENTION

Mode controlled analog integrators which include a high gain operational amplifier, a feedback capacitor and switching devices capable of placing the integrator into any of three modes of operation are well known in the prior art. The three modes of operation are normally: an operate mode where an input signal is integrated with respect to time producing an output signal; a hold mode where in the integrator stores the value of the output signal at the time of entering the hold mode; and an initial condition mode wherein a fixed voltage is applied to the feedback capacitor as an initial condition.

It is equally well known that electronic integrators in analog computers have multiple inputs which can provide different gain factors. An example of a multi-input integrator configuration is shown at page 18, FIG. 1–9, of the textbook Electronic Analog and Hybrid Computers, by Korn and Korn, published by McGraw-Hill Book Company in 1964. Each of the multiple inputs to the integrator have associated therewith input resistors whose values determine the gain from the input to the output of the integrator in conjunction with the feedback capacitor.

In the past, a multiple input analog integrator was switched from the operate mode to the hold mode by opening a switch which was interposed between the junction of all the input resistors and the input of the high gain operational amplifier. When devices such as relays were employed for this function, the low contact impedance achievable therewith presented no problem of interaction between the various input resistors.

It has become desirable to eliminate relays from equipment employing analog integrators by substituting field-effect transistors or the like therefor. This is due primarily to higher obtainable operating speeds, price, weight, size, and reliability considerations. It has been found that when a field-effect transistor is directly substituted for the relay used in the past, the on impedance thereof (approximately 50 ohms) is sufficiently large to cause interaction between the input resistors. The interaction occurs because an offset voltage is developed thereacross which is dependent upon the signals applied through each of the input resistors. The problem is particularly acute when signals are applied through the high gain input resistors.

Another problem of interaction which results from the use of the field-effect transistors is due to the fact that the off impedance thereof is not as high as the open impedance of a pair of relay contacts. Thus, by merely turning off a field-effect transistor, some impedance path is still provided to the integrator. When the integrator is in the hold mode, currents are therefore fed therethrough which over long intervals of time will deteriorate the accuracy of the integrator.

When electronic analog integrators are used in general purpose analog computers for the modeling and simulation of discontinuities, it has been necessary for the operator to connect external resistors with external switch control means to the inputs of said integrator amplifiers to effect the required operation. These external circuitry increase the cost and complexity of said equipment, and the interconnections required thereof are both time consuming and provide potential for operator error.

In addition, the external circuitry was operable independently of the mode controlling circuitry so that errors could arise through external connection of an integrating resistor to the amplifier during the hold mode of operation.

Therefore, it is an object of this invention to provide an improved electronic analog integrator.

Another object of this invention is to provide an electronic integrator in which relatively low interaction occurs between signals applied to various input resistors.

It is still another object of this invention to provide an electronic analog integrator in which minimum drifts occur during a hold operation due to leakage currents through a mode control switch.

It is yet another object of the invention to provide an electronic integrator in which the input resistors may be independently and selectively connected and disconnected to the amplified input terminal while the integrator is in the operate mode, thereby providing means for the modeling of discontinuities without additional circuit connections.

BRIEF DESCRIPTION OF THE INVENTION

With these and other objects in view, the present invention contemplates an integrator circuit in which a high gain negative feedback amplifier has a capacitor connected between the input and output thereof to perform a current integrating function. A first group of resistors is connected to the input by a field-effect transistor while a second group of resistors are each connected to the input by an individual field-effect transistor. The field-effect transistors are interconnected with each other to operate as a single switching system so that the resistors may be simultaneously disconnected from the input to provide the hold mode and simultaneously rendered independently connectable to the input under control of external switching signal sources.

In preferred embodiment an inverted bipolar transistor is connected to the junction of each field-effect transistor and its associated resistor to bring that junction to ground when the field-effect transistors are turned off. Typically, the second group of resistors have a value which is one-tenth of the value of the first group of resistors.

DESCRIPTION OF THE DRAWINGS

A more complete understanding of the invention can be had by reference to the following specification and drawings in which.

DETAILED DESCRIPTION OF THE INVENTION

Figure 1:
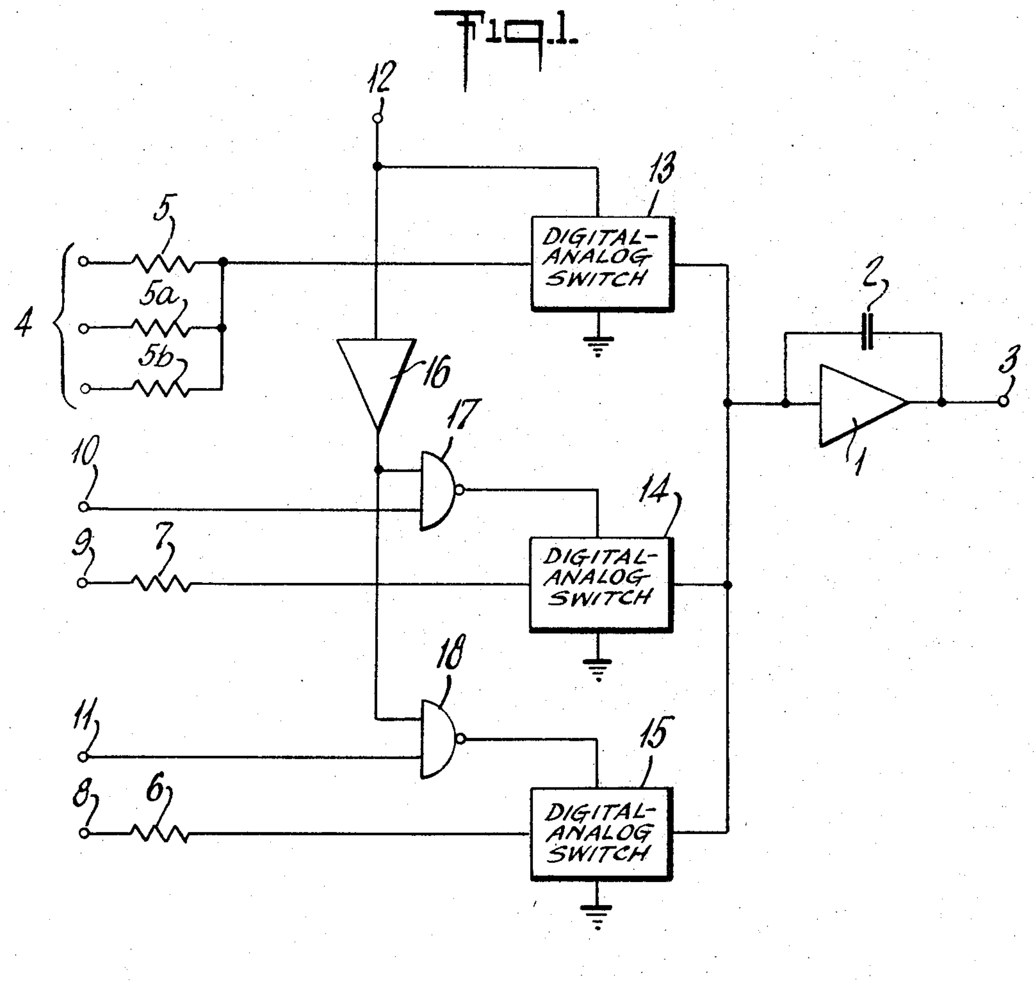
FIG. 1 is a schematic diagram of a circuit constructed in accordance with the teachings of this invention.

FIG. 1, numeral 1, denotes a high gain operational amplifier of the type typically employed in analog computers. A feedback capacitor 2 is connected between the input and output thereof and constitutes the integrating capacitor. The entire integrator assembly feeds an output signal to an output terminal 3, which in practice may be a multiplicity of terminals for connection to further computing elements of the analog computer. Input signals to the analog integrator are provided at any one of terminals 4 or at terminals 8 and 9. It will be understood that any number of these terminals may be connected to receive input signals at any one time. The input terminals 4 are connected to the input of high gain operational amplifier 1 via respective input resistors 5, 5*a*, and 5*b*. For example, these input resistors may have a value of one megohm; and consequently, with a feedback capacitor value of 1 mf., inputs 4 are designated gain one or unity gain inputs. An operate/hold, digital/analog switch 13 connects the various resistors 5, 5*a*, and 5*b* to the input of the operational amplifier 1.

The input terminals 8 and 9 also have respective resistors 6 and 7 associated therewith. In a typical case, these resistors have a value of 100 kilohms and are, therefore, denominated gain 10 inputs. Each of these resistors is connected to one side of digital/analog switches 14 and 15. The output of these switches are connected to the input of high gain operational amplifier 1.

Control for digital/analog switch 13 is provided from terminal 12 which receives an operate/hold command signal. More particularly, a logic low at terminal 12 will designate the operate mode and will close or render conducting switch 13. This operate terminal 12 is also connected to control the additional digital/analog switches 14 and 15 via control circuitry which will now be described. A logical inverter 16 is provided for polarity inversion purposes to invert the operate/hold control signal which appears at terminal 12. The output of the logical inverter 16 is connected as one input to NAND gates 17 and 18. Additional inputs to the NAND gates are provided by logic input terminals 10 and 11 respectively. More particularly, logic input terminal 10 is directly connected to NAND gate 17 while logic input terminal 11 is connected to NAND gate 18. The result here is that the operate control signal at terminal 12 is anded with an appropriate polarity logic signal at either of terminals 10 and 11 to produce a control signal to energize (close) either of switches 14 and 15 during the operate mode. If the operate control signal (logic low) is present on terminal 12 but terminals 10 and 11 are not energized (logic low), the NAND gate 17 or 18 associated with the de-energized terminal 10 or 11 will not close the associated switch 14 or 15. In this way, the signals on the terminals 10 and 11 determine which of the signals applied to the resistors 6 and 7 are added to the other signals to be integrated. It is to be noted that the control signals at terminals 10 and 11 need not be static or synchronous with the control signal at terminal 12.

In practice, the digital/analog switches employed in the present invention consist of field-effect transistors (FET). On employing a FET, there is always some measurable quantity of resistance provided even during the conducting state of the switching arrangement. In practice, the value of this resistance is approximately 50 ohms.

If a single field-effect transistor were employed to connect all the resistors 5, 5*a*, 5*b*, and 6 and 7 to the input of the amplifier 1, the junction thereof would no longer be at the virtual ground provided by the amplifier 1 when operated as an integrator. This would be due primarily to the current from the 100K resistors 6 and 7 flowing through the 50 ohm of the field-effect transistor. The currents provided through the 1 megohm resistors 5, 5*a*, and 5*b* on the other hand are one-tenth the magnitude of the currents provided by the resistors 6 and 7 and therefore having much less effect on the voltage at the junction point. Therefore, in accordance with this invention to overcome the problem of voltage offsets which result in interaction between the various summing resistors, separate field-effect switches 14 and 15 are provided for each of the 100K resistors 6 and 7. The 1 megohm resistors 5, 5*a*, and 5*b*, on the other hand, are connected together and to the input of the amplifier 1 by th field-effect transistor switch 13.

Figure 2:
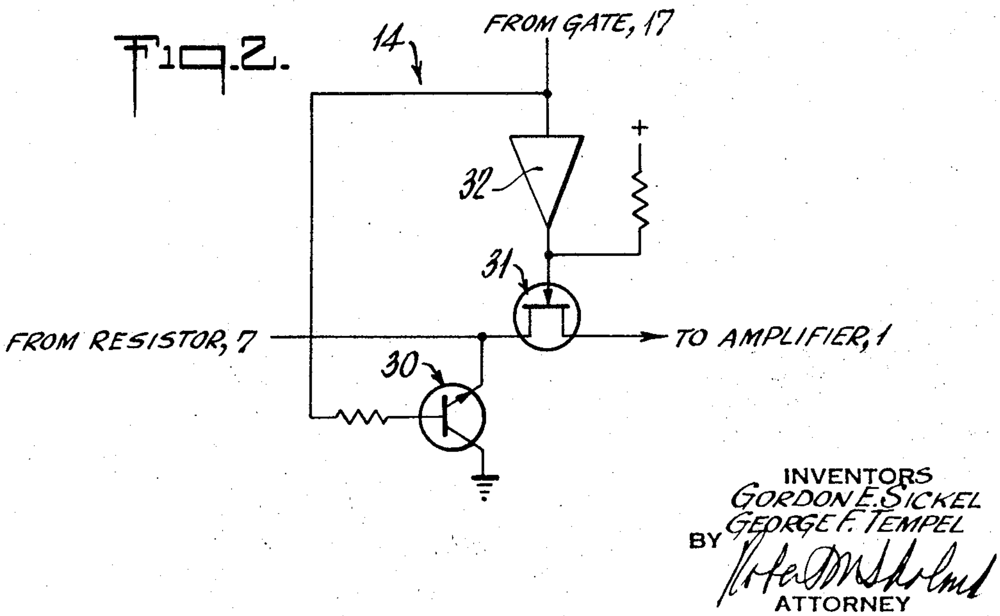
FIG. 2 is a schematic diagram of a digital/analog switch employed in the circuit of FIG. 1.

FIG. 2 of the subject invention shows a suitable digital/analog switch for employment in the schematic diagram of FIG. 1; for example, as switch 14. In FIG. 2, the switch 14 includes a shunt switching element consisting of transistor 30 and a series switching element consisting of N channel MOS field-effect transistor 31 or any other suitable FET. The transistors are driven from the NAND gate 17. The FET is connected between the resistor 7 and the input of the amplifier 1. As is well known, the on resistance of a field effect transistor being of the order of 50 ohms, the actual input resistance is equal to the value of R7 plus the resistance of the FET.

The switch 14 also includes an inverting amplifier (logic inverter) 32 which provides complementary control signals so that the transistor 30 is turned on when the field-effect transistor is turned off. In this way, the resistor 7 is connected to ground by the transistor 30 when the FET 31 is turned off. By doing this, no voltage is provided across the field-effect transistor 31 when it is off (because the input to the amplifier 1 is at a virtual ground) so that notwithstanding the fact that a finite impedance is provided thereacross, minimal leakage current will be presented to the amplifier for integration during the hold mode. It should be particularly noted that the transistor 30 is connected with its collector to ground and emitter to the resistor 7. This is an inverted arrangement which is used to provide minimal collector emitter saturation voltage.

It should be understood that while this invention has been described with respect to a particular embodiment thereof, numerous others will become obvious to those of ordinary skill in the art in light thereof.

What is claimed is:

1. An integrator circuit including:

a high gain amplifier having an input and an output;

a capacitor connected between said input and said output;

at least one first resistor having a first impedance value;

a second resistor having a second impedance value;

first means responsive to both a first and a second control signal for connecting said first resistor to said input;

second means responsive to both said first and a third control signal for connecting said second resistor to said input;

each of said connecting means including field-effect transistor means for controlling the connection of said first and second resistors, respectively, to said input, and means connected to said field-effect transistors for connecting said first and second resistors, respectively, to ground when they are not connected to said input; and logic gate means connected to each of said connecting means and to receive control signals, and said first and third control signals, respectively, for controlling said connecting means.

2. The circuit as defined in claim 1 in which each of said ground connecting devices is a transistor connected in an inverted polarity mode.

3. The circuit as defined in claim 2 also including:

a third plurality of resistors; each of said third plurality of resistors being of a third impedance value; and a third connecting means responsive to one of said control signals connecting each of said third plurality of resistors to said input.

4. The circuit as defined in claim 3 in which said first value is equal to said second value and said third value is ten times said first value.

5. An integrator circuit including:

a high gain amplifier having an input and an output;

a capacitor connected between said input and said output;

a first group of resistors each having first high impedance values;

a second resistor having a second lower impedance value;

first means responsive to a control signal for connecting all of said first resistors to said input;

second means responsive to said first control signal connecting said second resistor to said input;

each of said connecting means including a field-effect transistor for controlling the connection of said first resistor and said second resistor, respectively, to said input, and means connected to said field-effect transistor for connecting said first resistor and said second resistor, respectively, to ground when they are not connected to said input.

6. The circuit as defined in claim 5 in which each of said ground connecting devices is a transistor connected in an inverted polarity mode.

7. The circuit as defined in claim 6 in which said first value is ten times said second value.

8. The circuit as defined in claim 7 also including:

a third plurality of resistors; each of said third plurality of resistors being of said second value;

a plurality of connecting means responsive to said control signal for connecting each of said third plurality of resistors to said input.

9. The circuit as defined in claim 8 in which said plurality of connecting means each include a field-effect transistor for connecting said third plurality of resistors to said input.

10. The circuit as defined in claim 9 in which said plurality of connecting means each include a device responsive to said control signal for connecting said plurality of resistors to ground when they are not connected to said input.

11. The circuit as defined in claim 8 in which said second connecting means is disabled from connecting said second resistor to said input by a second control signal.

References Cited

UNITED STATES PATENTS

| | | | |
|---|---|---|---|
| 3,541,320 | 11/1970 | Beall | 328—127 X |
| 3,535,554 | 10/1970 | Webb | 307—243 |
| 3,601,631 | 8/1971 | Miller | 307—243 X |
| 3,539,936 | 11/1970 | McGhee | 328—127 |

HERMAN KARL SAALBACH, Primary Examiner

B. P. DAVIS, Assistant Examiner

U.S. Cl. X.R.

307—251; 328—127